(12) United States Patent
Kramer

(10) Patent No.: US 7,701,712 B2
(45) Date of Patent: Apr. 20, 2010

(54) COOLING UNIT

(75) Inventor: Tim Kramer, Solms (DE)

(73) Assignee: Rittal GmbH & Co. KG, Herborn (DE)

( * ) Notice: Subject to any disclaimer, the term of this patent is extended or adjusted under 35 U.S.C. 154(b) by 93 days.

(21) Appl. No.: 11/886,491

(22) PCT Filed: Mar. 3, 2006

(86) PCT No.: PCT/EP2006/001931

§ 371 (c)(1),
(2), (4) Date: Sep. 17, 2007

(87) PCT Pub. No.: WO2006/105834

PCT Pub. Date: Oct. 12, 2006

(65) Prior Publication Data

US 2008/0165473 A1 Jul. 10, 2008

(30) Foreign Application Priority Data

Apr. 8, 2005 (DE) .................. 10 2005 016 115
Nov. 21, 2005 (DE) .................. 20 2005 018 284 U

(51) Int. Cl.
  *H05K 7/20* (2006.01)
(52) U.S. Cl. ................................ 361/695; 361/678
(58) Field of Classification Search ............ 337/678; 361/678, 695
  See application file for complete search history.

(56) References Cited

U.S. PATENT DOCUMENTS 5,142,441 A * 8/1992 Seibold et al. ........... 361/689
6,134,109 A * 10/2000 Muller et al. ............. 361/700
6,375,561 B1 * 4/2002 Nicolai et al. ........... 454/184
6,488,214 B1 * 12/2002 Nicolai et al. ............. 237/69
6,935,419 B2 * 8/2005 Malone et al. ............ 165/185
6,975,509 B2 * 12/2005 Osborn et al. ......... 361/679.47
7,162,886 B2 * 1/2007 Maul ....................... 62/259.2
2002/0070006 A1 6/2002 Mok et al.
2002/0163781 A1 * 11/2002 Bartola et al. ............. 361/699
2002/0172008 A1 * 11/2002 Michael .................. 361/697
2003/0042003 A1 3/2003 Novotny et al.
2003/0178182 A1 * 9/2003 Pikovsky et al. ......... 165/80.4
2008/0117595 A1 * 5/2008 Kramer .................. 361/697

FOREIGN PATENT DOCUMENTS

| DE | 4330509 A1 * | 3/1995 |
| DE | 10 2004 055 815 A1 | 11/2005 |
| DE | 102007023980 B3 * | 9/2008 |
| JP | 08046381 A * | 2/1996 |

OTHER PUBLICATIONS

Co-Pending U.S. Appl. No. 10/572,998, filed Mar. 23, 2008; inventors Martin Lang et al.; title Mounting Plate for Electronic Components.

* cited by examiner

*Primary Examiner*—Anatoly Vortman
(74) *Attorney, Agent, or Firm*—Pauley Petersen & Erickson

(57) ABSTRACT

A cooling unit for integrating into a housing, especially a control box, including an assembly plate which is embodied to receive electrical components and has at least one cooling channel through which a coolant flows or is to flow. This invention provides the cooling unit with a compact structure and a high cooling performance. Thus, an air cooling unit with a fan is provided on the assembly plate for cooling warm air accumulated in the housing due to dissipated heat. The fan is used to guide the warm air along the assembly plate for cooling purposes.

13 Claims, 2 Drawing Sheets

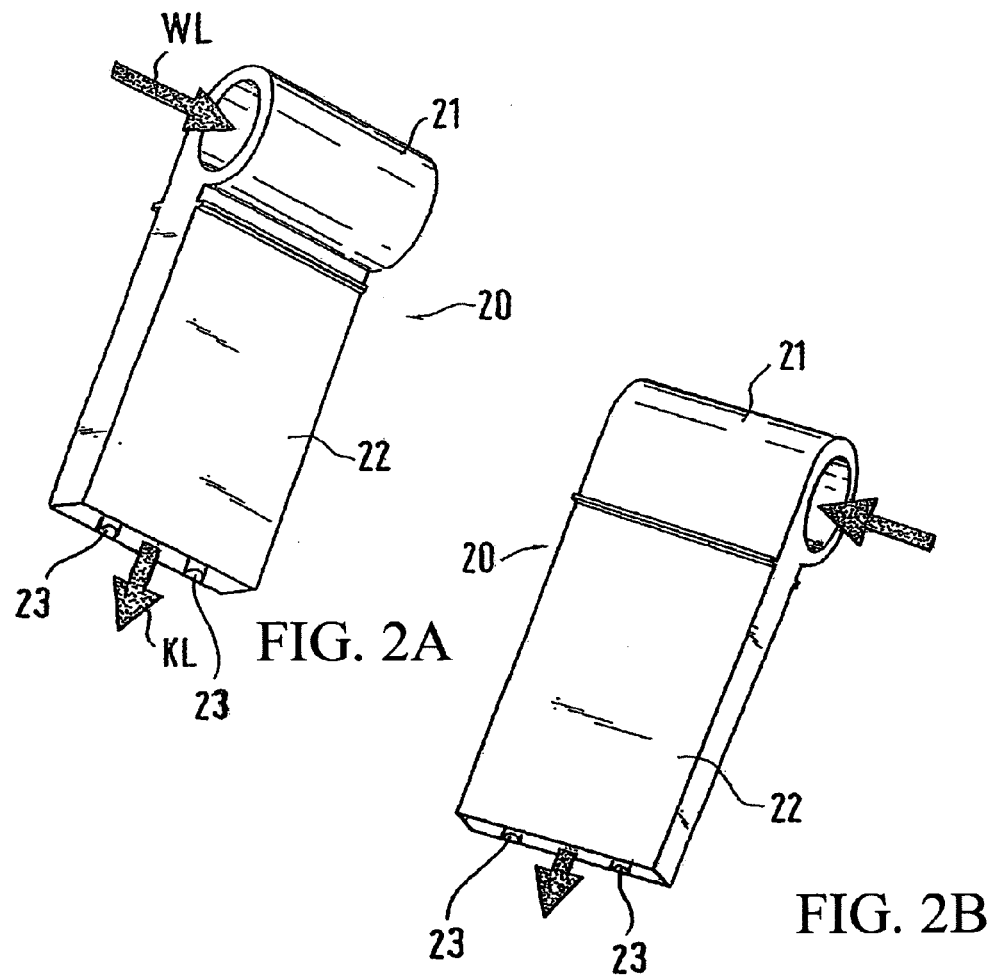
FIG. 2A
FIG. 2B
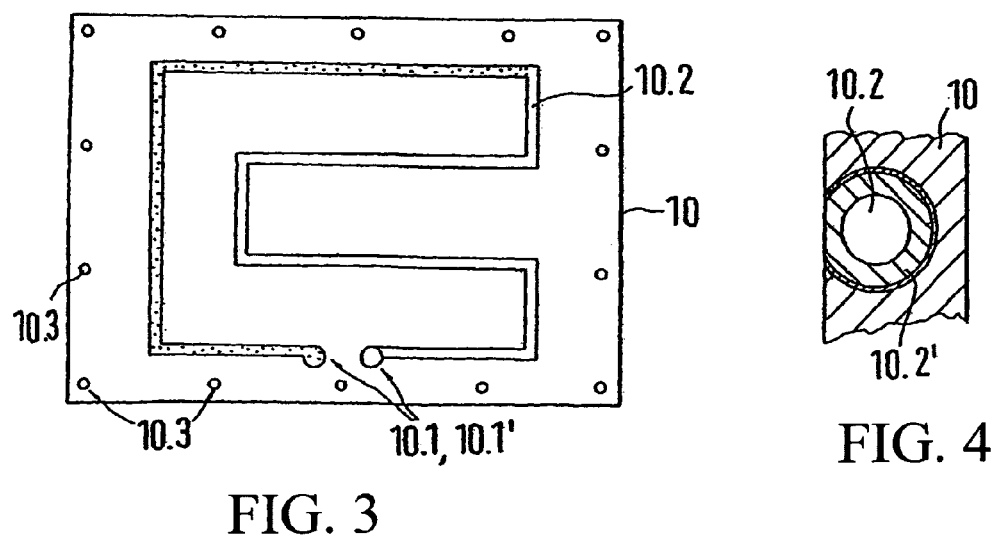
FIG. 3
FIG. 4 dissolved cordstyle US 7,701,712 B2

COOLING UNIT

BACKGROUND OF THE INVENTION

1. Field of the Invention

This invention relates to a cooling unit for installation in a housing, such as a switchgear cabinet, having a mounting plate for receiving electrical componentry and having at least one cooling channel through which a coolant can flow.

2. Discussion of Related Art

A cooling unit in the form of a cooling plate with a mounting on a flat exterior is taught by German Patent Reference DE 10 2004 055 815 A1. The mounting comprises undercut grooves extending parallel to each other, and fastening elements which can be inserted into them, by which waste heat-producing electric or electronic components, such as frequency converters, for example, can be attached to the flat side of the cooling plate by further mounting elements. Cooling channels, through which a liquid coolant flows, are formed in the cooling plate, which are connected by connecting lines to cooling units, for example a recooling installation, preferably arranged outside of the housing, or of the switchgear cabinet. Depending on the density of the wound cooling channels and the heat transport capability of the coolant, as well as the conductivity of the cooling plate, and further predeterminable parameters, a high cooling output can be achieved with such a construction, along with a space-saving, compact arrangement and versatile mounting options. Additional cooling units are for further components which produce waste heat in the housing. A relatively large cost outlay must be offered for cooling the ambient air in the housing, or in the switchgear cabinet, wherein cooling units, possibly with fans at appropriate locations, are to be installed.

SUMMARY OF THE INVENTION

One object of this invention is to provide a solution by which the cost outlay for cooling of the ambient air in a housing is reduced.

This object is attained with a cooling unit having characteristics taught in this specification and in the claims. An air cooling unit with a blower is on the mounting plate for cooling hot air produced in the housing by waste heat, by which the hot air is conducted flat along the mounting plate for cooling.

Here, an available mounting plate installed in the housing is usable, such as for cooling of possibly mounted electrical or electronic components and of distant components which produce waste heat, by cooling the hot air, wherein the good heat transfer properties and the large cooling surface of the mounting plate through which coolant flows are advantageously used.

Directed air guidance along the cooling surface is encouraged because the air cooling unit has an air guidance section arranged flat along the mounting plate.

An advantageous, broad-surfaced application of the air cooling unit and unrestricted definite air guidance is encouraged if the air guidance section is designed in the shape of a shaft and essentially extends over an entire width or length of the mounting plate. For example, the shaft-like air guidance section can have a shallow, rectangular cross section with a large contact surface or opening side toward the cooling surface.

Different variations of the air guidance and achieving cooling occur if the air is conducted longitudinally or transversely with regard to the cooling channels along the mounting plate. When guiding the air in the transverse direction with respect to the cooling channels, the inflow side of the warm air can be selected to be in the area of the cool side of the coolant or of the warm side.

For an effective heat exchange with the cooled mounting plate, it is possible to provide for an arrangement of cooling ribs extending in the air guidance section in the flow direction of the air. In this case, the cooling ribs can be embodied separately in the air guidance section, or they can be formed in one piece with the mounting plate and project into the air guidance section.

Further advantageous design options for a compact construction, or different assignment possibilities between the air cooling unit and the mounting plate, result if the mounting plate is an integral component of the air cooling unit, or if the air guidance section is applied to a flat side of the mounting plate.

Further advantageous variations for a two-dimensional air guidance, or a large flow output, result if the blower is designed as an axial or radial fan and extends with an outflow side along an edge of the mounting plate.

One embodiment is advantageous with respect to the construction and arrangement in a housing if the mounting plate is designed with a fastening for the attachment of components to be cooled on one of its sides, the flat front side, and if the air is conducted along the backside, facing away from the flat front side.

Manufacture and functional capability are encouraged if the at least one cooling channel has an inserted conduit, the conduit is pressed into a meander-like extending receiving channel machined-in from the flat side, preferably the rear, and is fixed in place therein, and if the respective side is subsequently worked until it is flat. Here, the conduit can be inserted by filler materials with good conductivity.

BRIEF DESCRIPTION OF THE DRAWINGS

This invention is explained in view of exemplary embodiments, making reference to the drawings, wherein:

FIGS. 2A and 2B show a further embodiment of a cooling unit in a schematic perspective view from the rear, or respectively the front;

FIG. 3 shows a view from above on the rear of the mounting plate in a schematic plan view; and FIG. 4 shows a cross-sectional partial area of the mounting plate in accordance with FIG. 3, in an enlarged representation.

DETAILED DESCRIPTION OF THE INVENTION

Figure 1A:
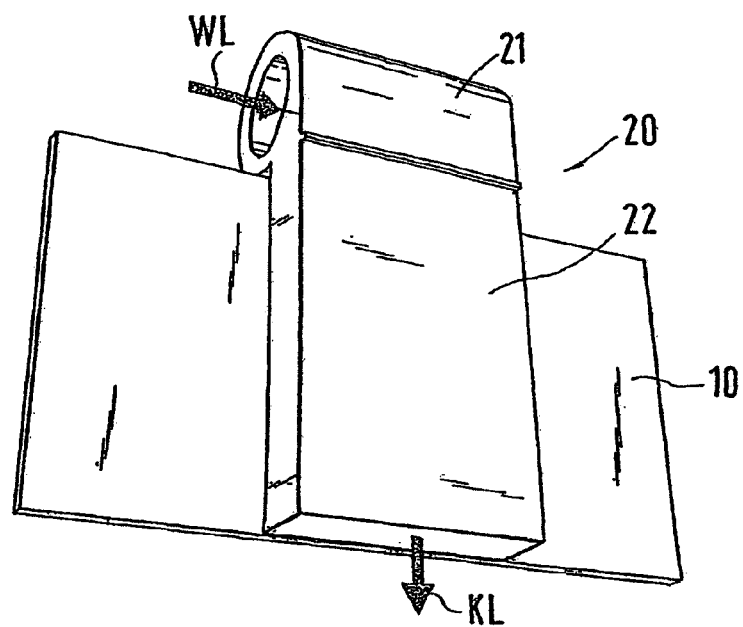
FIGS. 1A and 1B, a cooling unit with a mounting plate and an air cooling unit are shown in a schematic perspective view from the rear, or respectively the front.
Figure 1B:
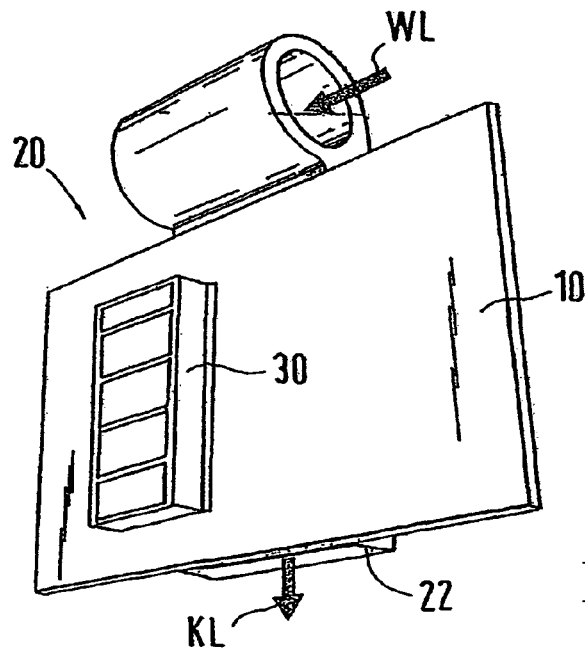

A cooling unit shown in FIGS. 1A and 1B, comprises a mounting plate 10 designed as a cooling plate, and an air cooling unit 20 having a blower 21 arranged on an upper edge of the mounting plate 10 and a flat air guidance section 22 applied flat to the rear of the mounting plate 10 and having a good air guidance contact, supports an electrical or electronic component 30 on its front, for example a frequency converter producing a relatively large amount of waste heat, or an electromechanical component, or the like. The component 30 is attached with close heat-conducting contact on the flat front face of the mounting plate 10 and is secured, for example, by undercut T-grooves and fastening elements inserted therein, such as shown in greater detail in German Patent Reference DE 10 2004 055 815 A1. Here, parallel mounting grooves and mounting strips fixed in place therein produce a multitude of attachment options. At least one more or less tight serpentine, through which a coolant flows, is attached to the mounting plate 10, for example, of copper or aluminum, or any other material with good heat-conducting properties, for removing the generated waste heat. With an inflow connector 10.1 and an outflow connector 10.1', the cooling channel 10.2 represented in FIGS. 3 and 4 has a connecting line, through which the cooled coolant is fed, or the heated coolant removed. It is advantageous to cool the coolant in a remote recooling installation, so that the switchgear cabinet interior, or the immediate area around the switchgear cabinet, are not burdened by the removed waste heat.

Advantageous control or regulation possibilities for the cooling output also result.

In the structure represented in cross section in FIG. 4, the cooling channel 10.2 is designed so that initially groove-like channels are machined from one of the flat sides, for example the rear of the mounting plate 10, into which one or several conduits 10.2' is pressed in order to assure, on the one hand, good heat contact with the conduits 10.2', which have good heat-conducting properties per se, and to secure attachment. The opening of the groove-shaped channels in the direction toward the flat side is narrower than their interior, so that the pressed-in conduit 10.2' is securely maintained. Following their insertion, protrusions of the conduit 10.2' on the flat exterior of the mounting plate 10 are worked until they are flat, for which purpose the conduits 10.2' have a sufficiently thick wall area. Also, gaps or uneven places being created are, for example, filled with a conductive glue or other similar material and are smoothed down. The mounting plate 10 can be attached at a suitable location, for example by fastening holes 10.3 arranged in its border area, to suitable profiled mounting elements or wall sections in the housing or the switchgear cabinet, in which case the rear supporting the air guidance section 22 leaves an appropriate distance free for the air guidance section 22 with respect to the wall sections or mounting elements of the housing.

As shown in FIGS. 1A, 1B, the blower 21, which is a radial blower, for example, is arranged along the upper edge of the mounting plate 10 and has a broad outflow area, which makes a transition into the correspondingly broadly laid out, shaft-like-designed air guidance section 22. The air guidance section 22 has a flat, rectangular-shaped cross section and rests with a large surface, for example of a width of more than 10 or 20 cm, on the rear of the mounting plate 10, so that the inflowing hot air WL is conducted along the cooling surface of the mounting plate 10 over a large surface and at the possibly least distance with a narrow flow cross section, for example a layer thickness of less than 10 or 5 cm. In this case, the flow direction of the air can extend transversely or linearly with respect to the main arrangement direction of the cooling channels 10.2, wherein the cold side of the coolant can be arranged near the inflowing hot air or near the cooling air KL flowing out of the air guidance section 22. In an alternative arrangement, the air flow extends in the longitudinal direction with respect to the cooling channels 10.2.

The air guidance section 22 can be produced, closed on all sides, of a material capable of conducting heat, or can be embodied with a U-shaped cross section with the open U-side aimed toward the flat side of the mounting plate 10, so that the air flows directly along the cooling flat side of the mounting plate 10. It is also possible to arrange cooling ribs 23, such as shown in FIGS. 2A and 2B, extending in the flow direction of the air in the air guidance section 22 which, with a U-shaped design of the air guidance section 22, can also be formed in one piece on the mounting plate 10.

In another embodiment, of the cooling unit the flat designed air guidance section 22 itself has integrally the bottom plate 10, as represented in FIGS. 2A and 2B. This design results in a particularly compact construction, wherein the conduct of the air to be cooled can be advantageously adapted to provide a large cooling output, wherein the flow cross section practically extends along the entire cooling surface.

The cooling air KL, which is advantageously downwardly discharged, is again available for cooling structural components provided in the housing, or the switchgear cabinet, or other components which are to be cooled.

The invention claimed is:

1. A cooling unit for installation in a housing, such as a switchgear cabinet, having a mounting plate (10) for receiving electrical componentry and at least one cooling channel (10.2) through which a coolant can flow, the cooling unit comprising:

an air cooling unit (20) with a blower (21) on the mounting plate (10) for cooling hot air produced in the housing by waste heat, by which the hot air is conducted flat along the mounting plate (10) for cooling, the at least one cooling channel (10.2) having an inserted conduit (10.2'), the conduit (10.2') pressed into a meander-like extending receiving channel machined-in from a flat side and fixed in place therein, and a respective side of the conduit subsequently worked until it is flat.

2. The cooling unit in accordance with claim 1, wherein the air cooling unit (20) has an air guidance section (22) arranged flat along the mounting plate (10).

3. The cooling unit in accordance with claim 2, wherein the air guidance section (22) is in a shape of a shaft and essentially extends over one of an entire width and an entire length of the mounting plate (10).

4. The cooling unit in accordance with claim 3, wherein the air is conducted one of longitudinally and transversely with respect to the cooling channels (10.2) along the mounting plate (10).

5. The cooling unit in accordance with claim 3, wherein cooling ribs extending in a flow direction of the air are arranged in the air guidance section (22).

6. The cooling unit in accordance with claim 5, wherein the mounting plate (10) is an integral component of the air cooling unit (20) or the air guidance section (22) is applied to a flat side of the mounting plate (10).

7. The cooling unit in accordance with claim 6, wherein the blower (21) is one of an axial fan and a radial fan and extends with an outflow side along an edge of the mounting plate (10).

8. The cooling unit in accordance with claim 7, wherein the mounting plate (10) has a fastening for attachment of components to be cooled on a flat front side, and the air is conducted along a backside, facing away from the flat front side.

9. The cooling unit in accordance with claim 1, wherein the air is conducted one of longitudinally and transversely with respect to the cooling channels (10.2) along the mounting plate (10).

10. The cooling unit in accordance with claim 2, wherein cooling ribs extending in a flow direction of the air are arranged in the air guidance section (22).

11. The cooling unit in accordance with claim 1, wherein the mounting plate (10) is an integral component of the air cooling unit (20) or an air guidance section (22) is applied to a flat side of the mounting plate (10).

12. The cooling unit in accordance with claim 1, wherein the blower (21) is one of an axial fan and a radial fan and extends with an outflow side along an edge of the mounting plate (10).

13. The cooling unit in accordance with claim 1, wherein the mounting plate (10) has a fastening for attachment of components to be cooled on a flat front side, and the air is conducted along a backside, facing away from the flat front side.

* * * * *